Nov. 26, 1968 KENJIRO KIMURA ETAL 3,413,603

SEMICONDUCTOR CHARACTER SENSING DEVICE

Filed April 16, 1965

INVENTORS
KENJIRO KIMURA
TSUTOMU SAIJI
YASUO KOJIMA
BY
ATTORNEY

United States Patent Office 3,413,603

Patented Nov. 26, 1968

3,413,603

SEMICONDUCTOR CHARACTER SENSING DEVICE

Kenjiro Kimura, 10–305, Kanaoka Kodan Jutaku, Kurotsuchimachi, Sakai; Tsutomu Saiji, 239, Sindomachi, Matsubara; and Yasuo Kojima, Shirakabaso 17–7, Seiwaenmachi, Swita, Osaka, Japan Filed Apr. 16, 1965, Ser. No. 448,777

Claims priority, application Japan, Apr. 22, 1964, 39/22,782

4 Claims. (Cl. 340—146.3)

ABSTRACT OF THE DISCLOSURE

A character sensing device comprising a thin plate of semiconductor material and strip junctions on each of the sides of said wafer of another semiconductor material. Said wafer being relatively thin so that radiant energy focused on one side of said wafer will penetrate the wafer and produce signals at the junctions on each side thereof.

This invention relates to a character sensing device and more specifically to a novel and improved device for electronically reading letters, symbols, patterns and the like in the form of two dimensional displays and producing identifying electric signals. While the device is generally useful in a wide variety of applications, it is particularly suitable for use as a position reader for position control when utilizing auomatic control techniques and as a device for converting figures, letters and other indicia into electric signals for direct application to a computer input.

Prior character sensing devices or readers have not been found entirely satisfactory principally because of the poor resolution and accuracy unless the device was relatively large. For example, one prior known character reader utilizes a plurality of photoelectric conversion elements, such as phototransistors or the like, arranged in a plane upon which an image of the character to be identified is projected. Since the phototransistors or other light sensitive elements each occupy a considerable space, it is quite evident that the reader must be of substantial area in order to accommodate an adequate number of photoelectric conversion elements to provide a reliable degree of resolution.

The character reader in accordance with the invention overcomes the difficulties encountered with prior known devices and provides a novel and improved reader that is small in size and yet affords a high degree of resolution.

Another object of the invention resides in a novel and improved character reader in the form of a wafer of semiconductor material and having a plurality of P–N junctions of minute area distributed throughout each side of the wafer and interconnected in such a manner that an individual set of identifying signals will be produced for each different character projected onto the surface of the wafer.

The P–N junctions on each side of the wafer are preferably arranged in the form of a series of parallel lines or strips with the strips on one side of the wafer being essentially perpendicular to the strips on the other side of the wafer. With this arrangement and when an image of a given character is projected onto one surface of the wafer utilizing radiant energy of a proper wavelength, a portion of the radiant energy will be absorbed by the near surface of the wafer and produce an electric charge. This charge will be absorbed by the nearest of the P–N junctions on the near surface and produce an electrical output. Inasmuch as the indicia will normally occupy a substantial area of the wafer, signals will be produced from a plurality of the P-N junction strips on one side of the wafer. A portion of the radiant energy forming the image to be resolved will also permeate deeper into the wafer and reach the vicinity of the rear surface thereof. This energy will be absorbed by the nearest of the P-N junctions on the rear surface and produce a second set of electrical signals. Since the junctions on the rear side of the wafer are at right angles to the junctions on the first side of the wafer, the two sets of signals can be utilized to identify the specific indicia being displayed on the wafer. Furthermore, the indicia or pattern can be reproduced utilizing the two sets of signals generated in the manner described above.

The semiconductor wafer for use in a character reader in accordance with the invention may be made of silicon, cadmium sulphide, selenium or the like. In the case of silicon, the character reader will be sensitive to radiation having wavelengths of the order of 600 to 1100 millimicrons though it has been found that its conversion efficiency will decrease at wavelengths above 1000 millimicrons and such long wavelengths also result in a poorer signal to noise ratio which of course is not desirable. By utilizing a wafer of silicon having a thickness of about 100 microns or less, radiant energy of a wavelength of about 900 millimicrons will permeate the wafer and produce an efficient device having relatively high resolution.

The P-N junctions on the surface of the wafer may be formed in any suitable manner by diffusing impurities which will produce a conductivity opposite to that of the wafer material. The thickness of the diffusion layers forming the P-N junctions should preferably be of the order of two to three microns in thickness so that relatively short wavelengths of the order of 600 millimicrons will permeate the wafer with little attenuation. The formation of P-N junctions to provide a plurality of parallel lines can be achieved either by removing selected portions of each diffused layer by sandblasting or etching or by the preferred process which involves a selective diffusion method. By utilizing selective diffusion, increased mechanical strength and dimensional accuracy are obtained and the method is carried out by providing a mask of silicon oxide on each wafer surface prior to the diffusion of the selected impurities to provide the P-N junctions. In this way, diffusion of the impurities will occur only in the unmasked areas and pitches of as small as 100 microns are readily obtainable.

The light used for the projection of a pattern on the character reader in accordance with the invention may be monochromatic light having a wavelength of the order of 900 millimicrons in which case a portion of the light will be absorbed by a relatively shallow layer of the wafer adjoining the front surface of the character reader and produce signals at the junctions on the near side while another portion of the light will penetrate the wafer and produce a second set of signals on the rear side. If desired, the light used to project an image on the wafer may include relatively long wavelengths of the order of 900 millimicrons and relatively short wavelengths of the order of 700 millimicrons. Under these conditions, the shorter wavelengths will be readily absorbed by a shallow portion of the wafer adjoining the front surface while the longer wavelengths will penetrate the wafer to produce signals on the rear side thereof.

The above and other objects and advantages of the invention will become more apparent from the following description and accompanying drawings forming part of this application.

Figure 1:
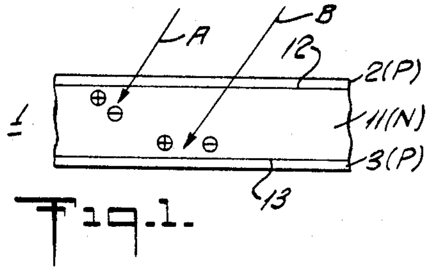
FIGURE 1 is a greatly enlarged cross-sectional view of a fragmentary portion of a character reader in accordance with the invention to illustrate the manner in which the character reader responds to incident radiation.

Referring now to the drawings and more specifically to FIGURE 1 thereof, the numeral 1 generally denotes the light sensitive device in accordance with the invention and having a total thickness not generally exceeding 100 microns. Assuming that the body or wafer 11 of the sensing device or character reader 1 is formed of silicon having a negative conductivity, then the diffusion layers 2 and 3 would be formed of a material having a positive conductivity to provide P-N junctions 12 and 13 respectively. The layers 2 and 3 each have a depth preferably of the order of two to three microns. If the body 11 is formed of a material having a positive conductivity, then of course the layers 2 and 3 should be formed by the diffusion of impurities producing layers of negative conductivity.

When the layers 2 and 3 are of a positive conductivity and the resultant structure is irradiated with light having a relatively short wavelength of the order of 700 microns, the light, as represented by the arrow A, will permeate the layer 2 and be absorbed by a relatively shallow portion of the body 11 adjoining the layer 2 thus producing holes and electrons. Both the holes and the electrons produced by the radiant energy A will move to the border or junction 12 whereupon the holes and electrons will separate and produce a potential difference between the body 11 and the layer 2. Irradiation of the device 1 by relatively long wavelength light of the order of 900 millimicrons, as represented by the arrow B, will result in substantial penetration of the device 1 and produces holes and electrons in the vicinity of the diffusion layer 3. These holes and electrons will move toward the P-N junction 13 whereupon they will separate and produce a potential difference between the layer 3 and the body 11. While the major portion of the relatively long wavelengths penetrates the body 11 of the wafer, it has been found that a portion of these wavelengths will also be absorbed by a shallow portion of the body 11 adjoining the layer 2 so that the invention may be utilized either with a monochromatic wavelength of the order of 900 millimicrons or with combinations of wavelengths, as, for instance, 700 millimicrons and 900 millimicrons.

Figure 2:
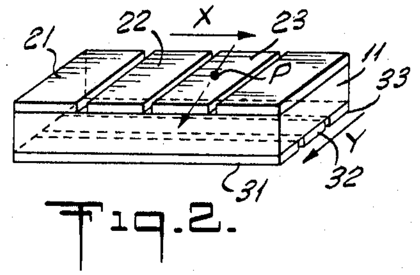
FIGURE 2 is an enlarged perspective view of a portion of a character reader in accordance with the invention.

A fragmentary section of a preferred embodiment of the invention is illustrated in FIGURE 2. The body of the sensing device is generally denoted by the numeral 11 and the diffusion layer 2 is divided into a plurality of strips 21, 22, 23, etc. which extend in the X direction. The diffusion layer 3 on the opposite side of the body 11 is in the form of parallel strips 31, 32, 33, etc., which extend in the Y direction and generally perpendicular to the strips 21, 22, 23, etc. With this arrangement and when light having both long and short wavelengths as described above is irradiated, for example, on a point P, an electrical signal will be produced on the strip 23 and on the strip 32 which is on the opposite side of the body 11. The production of these two signals then defines the specific location of the point P. It follows therefore that by the location of a plurality of individual points it is possible to identify images of indicia projected onto the surface of the sensing device 1.

In order to obtain a high degree of resolution, it is desirable to form the strip junctions on each side of the body 11 by the mask diffusion method. This method utilizes optical projection means to form a silicon oxide film on portions of the surfaces of the body 11 which are not to receive the diffusion layers which will result in the P-N junction strips. Thus, the oxide film will form a plurality of parallel strips on each side of the body which will ultimately comprise the spaces between the P-N junctions. Thereafter, both sides of the body are diffused with an appropriate impurity producing the strips 21, 22, 23, etc., on one side and 31, 32, 33, etc., on the other side. Inasmuch as the mask diffusion method is a well-known technique, further detailed description is not deemed necessary.

Figures 3, 4, 5:
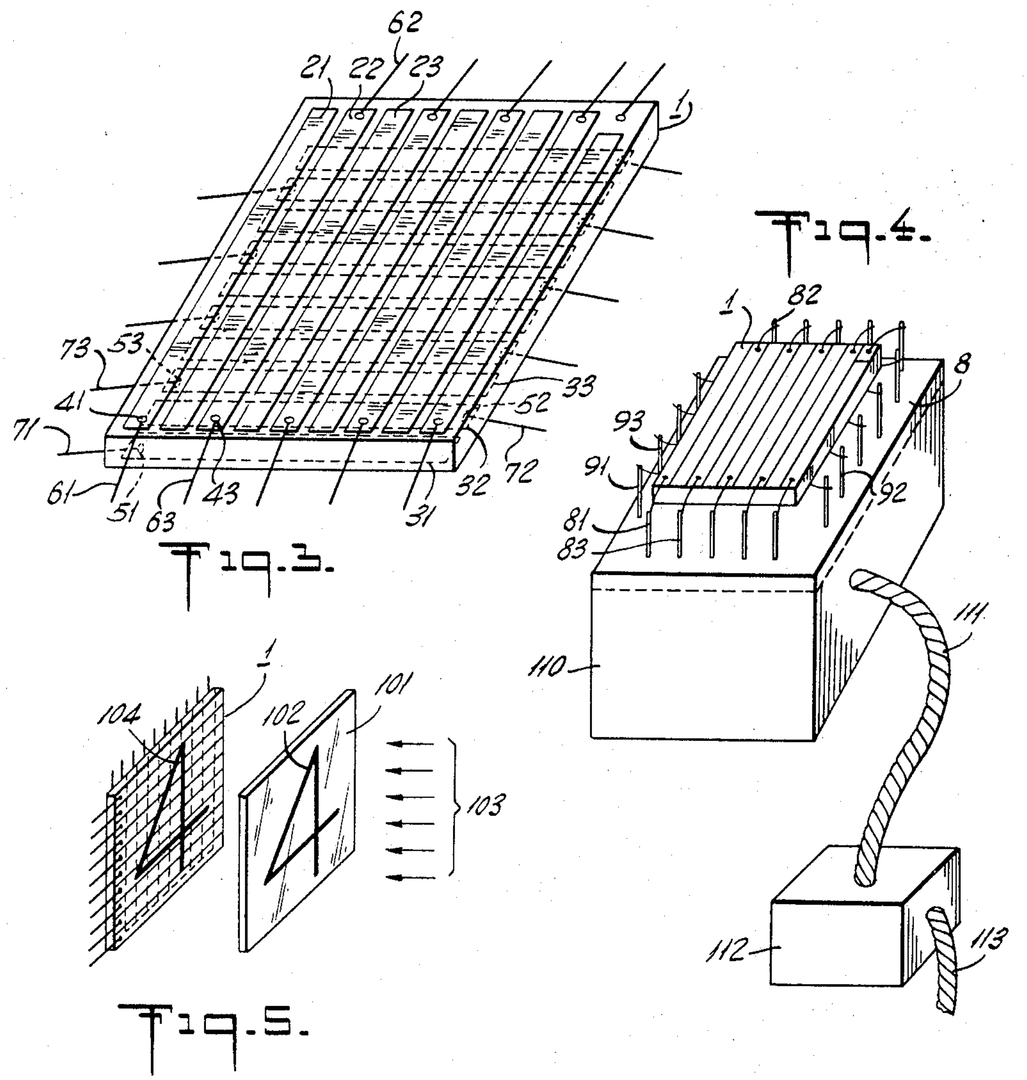
FIGURE 3 is a perspective view of a character reader in accordance with the invention and with the junction strips on each side thereof greatly enlarged for explanatory purposes.
FIGURE 4 is a perspective view of the character reader in accordance with the invention and showing one method for mounting the wafer and connecting it to associated electrical apparatus.
FIGURE 5 illustrates one method for the projection of an image on the character reader in accordance with the invention.

After the strip junctions have been formed on both surfaces of the body 11, lead wires are then attached to each of the strips as shown in FIGURE 3. More specifically, the strip junctions 21, 22, 23, etc. have ohmic contacts 41, 42, 43, etc., to which lead wires 61, 62, 63, etc., are connected respectively. Similarly, ohmic contacts 51, 52, 53, etc., are formed at the end portions of the strip junctions 31, 32, 33, etc., and lead wires 71, 72, 73, etc., are connected to the last said contacts. The ohmic contacts can be effected by bonding a fine gold wire through the application of heat and pressure to each of the strip junctions.

When the spacing of the strip junctions is very narrow or if the area of the sensing device 1 is large compared to its thickness and therefore easily broken during handling, the device 1 may be supported by a base 8 as shown in FIGURE 4. In this case, the base 8 would be provided with a series of pins or terminals 81, 82, 83, etc. for attachment of the lead wires 61, 62, 63, etc., and a second set of pins or terminals 91, 92, 93, etc., for attachment of the lead wires 71, 72, 73, etc. The base 8 may be mounted on a suitable housing 110 with a cable 111 comprising a plurality of leads connecting each of the pins on the plate 8 with suitable electrical apparatus 112 which correlates the information received from the character sensing device 1 and produces electrical signals in the cable 113 corresponding to the image of the particular indicia projected thereon.

Projection of the image of a given character onto the character sensor 1 may be accomplished in any suitable manner. One procedure for the attainment of this end is shown in FIGURE 5 wherein a character or pattern 102 is formed on a transparent glass plate 101. Light, in the form of a plurality of parallel rays 103, is projected through the plate 101 and thus forms an image 104 on the character sensor 1. This action produces a plurality of signals on each side thereof, and by correlating these two sets of signals as described above, the particular letter, number or other pattern can be identified. If desired, the plate 101 can be placed in contact with the front surface of the sensor 1 or the image of the character or indicia to be identified can be projected on the surface of the character reader 1 by utilizing a conventional projection lens.

While only one embodiment of the invention has been illustrated and described, it is apparent that alterations, modifications and changes may be made without departing from the true scope and spirit thereof as defined by the appended claims.

What is claimed is:

1. A radiant energy responsive character sensing device comprising a wafer of semiconductor material of one conductivity type and a thickness permitting at least part of the radiant energy to completely penetrate the wafer, a plurality of closely spaced junctions on each side of said wafer and formed of a material having another conductivity type, said junctions on one side of said wafer being in the form of a series of spaced parallel strips extending in one direction and the junctions on the other side being in the form of a series of spaced parallel strips extending in a direction differing from the direction of the junctions on said one side of said wafer, and terminals connected to each of said junctions and to said wafer, said device producing two sets of signals upon irradiation by energy defining an image of a character to be identified.

2. A character sensing device according to claim 1 wherein the strip junctions on opposing sides of said wafer are mutually perpendicular.

3. A character sensing device according to claim 1 wherein said wafer is formed of silicon having a thickness not exceeding 100 millimicrons.

4. A radiant energy character sensing device comprising a wafer of semiconductor material of one conductivity type, a plurality of closely spaced parallel strip junctions formed on one side of said wafer by diffusion of material having another conductivity type, a plurality of closely spaced parallel strip junctions formed on the other side of said wafer by the diffusion of material having said other conductivity type, ohmic contacts on each strip junction, electronic character-identifying means connected to said contacts and means irradiating one side of said wafer with energy defining a character to be identified, said energy penetrating said wafer and producing electric signals at said junctions, said signals being correlated by said electronic means to identify electrically said character.

References Cited

UNITED STATES PATENTS

| | | | |
|---|---|---|---|
| 3,026,417 | 3/1962 | Tomlinson | 338—17 X |
| 3,026,418 | 3/1962 | Nixon | 338—17 X |
| 3,160,854 | 12/1964 | Gregory | 250—211 X |

MAYNARD R. WILBUR, *Primary Examiner.*

J. SHERIDAN, *Assistant Examiner.*